United States Patent
Mancini et al.

(10) Patent No.: US 11,888,471 B2
(45) Date of Patent: Jan. 30, 2024

(54) JOSEPHSON PARAMETRIC CONVERTER HAVING IMPEDANCE-MATCHING NETWORKS

(71) Applicant: International Business Machines Corporation, Armonk, NY (US)

(72) Inventors: Corrado P Mancini, Peekskill, NY (US); Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 148 days.

(21) Appl. No.: 17/562,345

(22) Filed: Dec. 27, 2021

(65) Prior Publication Data

US 2023/0208419 A1    Jun. 29, 2023

(51) Int. Cl.
| | |
|---|---|
| H03K 17/92 | (2006.01) |
| G06N 10/40 | (2022.01) |
| H03H 7/38 | (2006.01) |

(52) U.S. Cl.
CPC ............ *H03K 17/92* (2013.01); *G06N 10/40* (2022.01); *H03H 7/38* (2013.01)

(58) Field of Classification Search
CPC .................................................... H03K 17/92
USPC ........................................................ 327/528
See application file for complete search history.

(56) References Cited

U.S. PATENT DOCUMENTS

| | | |
|---|---|---|
| 9,548,742 B1 | 1/2017 | Abdo |
| 9,697,473 B2 | 7/2017 | Abdo |
| 9,843,312 B2 | 12/2017 | Abdo |
| 10,122,329 B2 | 11/2018 | Hofheinz et al. |
| 10,211,798 B2 | 2/2019 | Abdo |
| 10,276,772 B2 | 4/2019 | Abdo |
| 10,491,178 B2 | 11/2019 | Naaman et al. |
| 10,693,566 B2 | 6/2020 | Sliwa et al. |
| 10,740,688 B2 | 8/2020 | Selvanayagam et al. |
| 10,998,869 B2 | 5/2021 | Miano et al. |
| 2016/0308502 A1 | 10/2016 | Abdo et al. |
| 2017/0229633 A1 | 8/2017 | Abdo |
| 2020/0127186 A1 | 4/2020 | Abdo |

OTHER PUBLICATIONS

Bergeal et al., "Phase-preserving amplification near the quantum limit with a Josephson ring modulator", May 2010 (Year: 2010).*

(Continued)

*Primary Examiner* — Tomi Skibinski
(74) *Attorney, Agent, or Firm* — Amin, Turocy & Watson, LLP

(57) ABSTRACT

One or more systems, devices and/or methods of use provided herein relate to a device that can provide bandwidth and/or saturation power to amplify a plurality of readout frequencies or to convert one or more frequencies. In quantum technology, the one or more systems, devices and/or methods of use provided herein can be employed to simultaneously readout a plurality of qubit resonators. A device can comprise a Josephson parametric converter device comprising a Josephson ring modulator having a pair of nodes, and an impedance matching circuit network operatively connected across the pair of nodes. The device can be separately operable in an amplification mode or in a conversion mode.

25 Claims, 10 Drawing Sheets

(56) References Cited

OTHER PUBLICATIONS

Sliwa, et al., "Reconfigurable Josephson Circulator/Directional Amplifier," Physical Review X 5, 041020 (2015) DOI: 10.1103/PhysRevX.5.041020.

Abdo, et al., "Active protection of a superconducting qubit with an interferometric Josephson isolator," Nature Communications | (2019) 10:3154 | https://doi.org/10.1038/s41467-019-11101-3 | www.nature.com/naturecommunications.

Abdo, et al., "On-chip single-pump interferometric Josephson isolator for quantum measurements," arXiv:2006.01918v1 [quant-ph] Jun. 2, 2020.

Abdo, et al., "Non-degenerate, three-wave mixing with the Josephson ring modulator," arXiv:1208.3142v1 [cond-mat. supr-con] Aug. 15, 2012.

Abdo, et al., "Multi-Path Interferometric Josephson Directional Amplifier for Qubit Readout," arXiv:1710.02521v1 [physics.ins-det] Oct. 8, 2017.

Abdo, et al., "Full Coherent Frequency Conversion between Two Propagating Microwave Modes," PRL 110, 173902 (2013), DOI: 10.1103/PhysRevLett.110.173902.

Abdo, et al., "Josephson Directional Amplifier for Quantum Measurement of Superconducting Circuits," PRL 112, 167701 (2014), DOI: 10.1103/PhysRevLett.112.167701.

Bergeal, et al., "Phase-preserving amplification near the quantum limit with a Josephson ring modulator," vol. 46516 May 2010| doi: 10.1038/nature09035.

Abdo, et al., "Josephson amplifier for qubit readout," Applied Physics Letters 99, 162506 (2011); doi: 10.1063/1.3653473.

Narla, et al., "Wireless Josephson Amplifier," arXiv:1404.4979v2 [quant-ph] Jul. 21, 2014.

Roch, et al., "Widely Tunable, Nondegenerate Three-Wave Mixing Microwave Device Operating near the Quantum Limit," PRL 108, 147701 (2012), DOI: 10.1103/PhysRevLett.108.147701.

Naaman, et al., "High Saturation Power Josephson Parametric Amplifier with GHz Bandwidth," 2019 IEEE MTT-S International Microwave Symposium (IMS) (2019).

Pillet, et al., "A compact design for the Josephson mixer: The lumped element circuit," Applied Physics Letters 106, 222603 (2015) [http://dx.doi.org/10.1063/1.4922188].

Roy, et al., "Broadband parametric amplification with impedance engineering: Beyond the gain-bandwidth product," Appl. Phys. Lett. 107, 262601 (2015); doi: 10.1063/1.4939148.

Mutus, et al., "Strong environmental coupling in a Josephson parametric amplifier," Applied Physics Letters 104, 263513 (2014), [http://dx.doi.org/10.1063/1.4886408].

Mell et al., "The NIST Definition of Cloud Computing," Recommendations of the National Institute of Standards and Technology, NIST Special Publication 800-145, Sep. 2011, 7 pages.

International Search Report and Written Opinion received for PCT Application Serial No. PCT/EP2022/087114 dated Jun. 9, 2023, 19 pages.

* cited by examiner

JOSEPHSON PARAMETRIC CONVERTER HAVING IMPEDANCE-MATCHING NETWORKS

FIELD OF INVENTION

The present disclosure relates to signal amplification and signal movement within a frequency space, and more specifically to performance of one or more of these operations by a Josephson parametric converter having impedance-matching networks.

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

On a large scale, quantum computing cloud service providers can execute millions of quantum jobs for users during a year. Each quantum job can include the execution of one or more quantum programs. Where qubit states only can exist (or can only be coherent) for a limited amount of time, an objective of operation of a quantum logic circuit (e.g., including one or more qubits) can be to reduce the time of the operation and/or increase the speed of the operation. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in some cases. Further, operations on qubits generally introduce some error, such as some level of decoherence and/or some level of quantum noise, further affecting qubit availability. Quantum noise can refer to noise attributable to the discrete and/or probabilistic natures of quantum interactions. Device designs that prolong the lifetime of the quantum state and extend the coherence time can be desirable.

Also, on the large scale, a large quantity of quantum jobs can create pressure to execute the respective quantum programs quickly. That is, increased speed of execution can directly and/or indirectly correlate to maximizing system usage, minimizing users having to wait for measurement results, and/or minimizing undesirable consuming of classical computational resources. Pressure also can be created to execute these quantum jobs well, so that a most performance can be extracted from near-term error-prone systems and/or so that a quality of measurements relative to the one or more qubits of the respective quantum systems compiling into physical-level pulses can be improved (e.g., related to accuracy, precision and/or measurement efficiency).

Physical, real-world, quantum logic circuits controlled by a quantum system can include a plurality of qubits. One type of qubit, a superconducting qubit, can include a Josephson junction, and operates generally only within a cryogenic chamber, such as a dilution refrigerator. One or more such superconducting qubits can be multiplexed per measurement circuit contained within the cryogenic chamber.

Josephson parametric converters (JPCs) are nondegenerate three-wave mixing devices that operate near the quantum noise limit. They can serve as preamplifiers in high-fidelity qubit readout setups and can enable lossless quantum transduction in the microwave domain. They constitute the basic building block in frequency-preserving nonreciprocal devices operated with a single pump tone, such as Josephson directional amplifiers and Josephson isolators.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate a process to increase bandwidth and/or saturation power of a Josephson device, such as a Josephson parametric converter. In the quantum realm, such achievements can allow for readout of multiple qubit resonators simultaneously facilitated by a common Josephson parametric converter device.

In accordance with an embodiment, a device can comprise a Josephson parametric converter (JPC) comprising a Josephson ring modulator (JRM) having a pair of nodes, and an impedance matching circuit network operatively connected across the pair of nodes.

In accordance with another embodiment, a method can comprise increasing bandwidth, by a system operatively coupled to a processor, of a Josephson parametric converter (JPC) device comprising a Josephson ring modulator (JRM) having a pair of nodes by operatively coupling, by the system, an impedance matching circuit network across the pair of nodes.

In accordance with yet another embodiment, a system can comprise a processor, a chip controlled by the processor, and a Josephson parametric converter (JPC) device, comprising a Josephson ring modulator (JRM) having a pair of nodes and an impedance matching circuit network operatively connected across the pair of nodes.

An advantage of the aforementioned device, system and/or method can be increased bandwidth and/or saturation power of the device.

In one or more embodiments of the aforementioned device, system and/or method, the device can comprise the JRM having another pair of nodes, and another impedance matching circuit network operatively connected across the another pair of nodes. An advantage can be facilitating an amplification mode with increased bandwidth for simultaneously reading out states from a plurality of qubits.

In one or more embodiments of the aforementioned device, system and/or method, the device can be separately operable in an amplification mode or in a conversion mode. An advantage can be utility and resiliency as compared to existing technologies.

In one or more embodiments of the aforementioned device, system and/or method, the JRM can comprise matrices of Josephson junctions connected in series between adjacent nodes along an external ring of the JRM. An advantage of this can be both an increase in saturation power and an increase in bandwidth of the device.

In accordance with still another embodiment, a device can comprise a Josephson ring modulator (JRM) having a plurality of nodes, one or more impedance matching circuit networks operatively connected to the JRM, and a pumping circuit operatively connected to the plurality of nodes of the JRM.

An advantage of the device can be increased bandwidth and/or saturation power of the device.

In accordance with yet another embodiment, a device can comprise a plurality of stacked layers, and a Josephson ring modulator (JRM) arranged at one or more of the stacked layers, wherein nodes of the JRM are oriented at corners of a footprint of the JRM on one of the stacked layers.

An advantage of the method can be limiting the amount of crossover of nodes to signal and idler ports of a JPC device employing the JRM.

DETAILED DESCRIPTION

Figure 1:
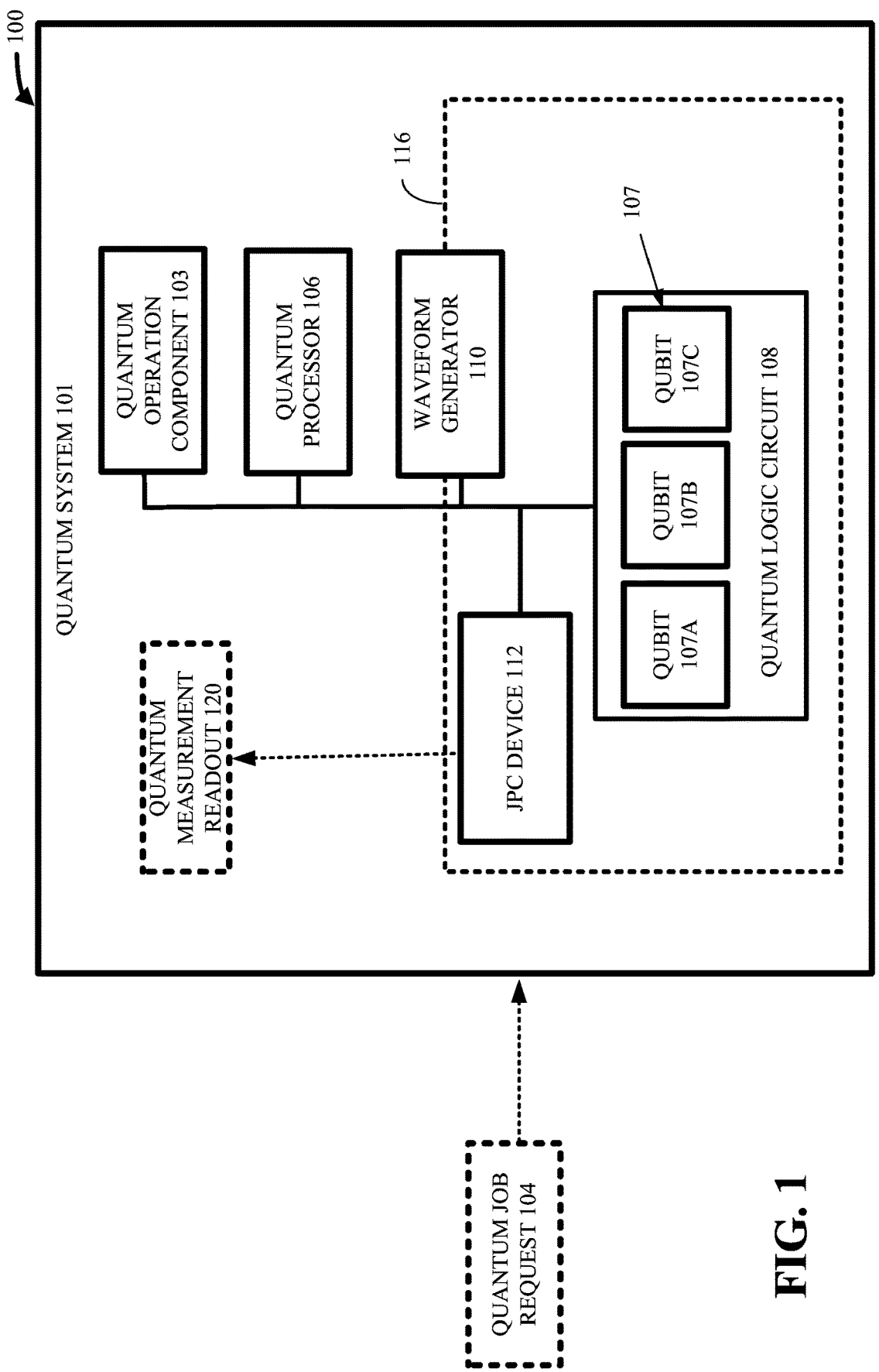
FIG. 1 illustrates a block diagram of an example, non-limiting system that can facilitate measurement readout from one or more qubits and/or which can convert a frequency, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. However, in various cases, that the one or more embodiments can be practiced without these specific details.

Quantum computation utilizes a qubit as its essential unit instead of a classical computing bit. A qubit (e.g., quantum binary digit) is a quantum-mechanical analog of a classical bit. Whereas classical bits can employ only one of two basis states (e.g., 0 or 1), qubits can employ superpositions of those basis states (e.g., $\alpha|0\rangle+\beta|1\rangle$, where $\alpha$ and $\beta$ are complex scalars (such that $|\alpha|^2+|\beta|^2=1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits, partaking of the quantum mystique, can occupy a superposition of 0 and 1 states. It is not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1.

Indeed, general quantum programs can employ coordination of quantum and classical parts of a computation. One way to contemplate general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of computation is neither its source language description nor target machine instructions, but something in between. Compilers can utilize several IRs during a process of translating and optimizing a program. An input is a source code describing a quantum algorithm and compile time parameter (s). An output is a combined quantum/classical program expressed using a high-level IR. A distinction between quantum and classical computers is that the quantum computer is probabilistic, thus measurements of algorithmic outputs provide a proper solution within an algorithm specific confidence interval. Computation is repeated until a satisfactory probable certainty of solution can be achieved.

By processing information taking advantage of quantum mechanics, quantum computers can offer novel ways to perform computation tasks such as molecular calculations, optical photons, optimization, and many more. Many algorithms and system components can be introduced to perform such computational tasks efficiently.

In current technologies, whether quantum or otherwise, efficient and/or quick readout of electronics and/or conversion of a frequency can be limited by bandwidth, amplification power and/or saturation power, for example.

One or more devices, systems and/or methods described herein can account for one or more of these deficiencies, and thereby allowing for more efficient readout and/or frequency conversion. In the quantum realm, such one or more devices, systems and/or methods can allow for simultaneous readout of multiple qubit resonators across varying frequencies, and thus over a large bandwidth not possible with existing technologies. In one or more cases, such ability can allow for increasing the number of qubits in a chain, layout or other grouping, relative to existing technologies. Further, saturation power can be increased along with the bandwidth.

To accomplish one or more of these features, a Josephson parametric converter (JPC) device can be employed. JPCs are components used in the readout chain most commonly as amplifiers to increase the readout signal power to be readout by classical electronics. Generally, this can be referred to as a wideband JPC with impedance matching networks. The JPC can be a nondegenerate three-wave mixing device which has two resonant modes which can be accessed through individual pairs of nodes. These resonant modes can be referred to as the signal resonant mode (X-mode) and idler resonant mode (Y-mode).

Two separate operation mode embodiments can be the amplification mode wideband JPC and conversion mode wideband JPC, different from the aforementioned resonant modes. Amplification mode JPCs can be used to amplify readout signals. Conversion mode JPCs can aid in avoiding frequency crowding by moving signal in frequency space if needed. Both the amplification mode wideband JPC and conversion mode JPC can be building blocks of more complex non-reciprocal circuits such as the Josephson directional amplifier (JDA) and Josephson isolator (JIS).

One or more JPC devices according to one or more embodiments described herein can include a Josephson ring modulator (JRM), which is a nonlinear dispersive element based on Josephson junctions that can perform three-wave mixing of microwave signals at the quantum limit. The JRM can include a plurality of Josephson Junctions (JJs). In order to construct a non-degenerate parametric device that is the Josephson parametric converter (JPC), which is capable of amplifying and/or mixing microwave signals at the quantum limit, the JRM can be operatively coupled to one or more impedance matching network circuits (IMNCs).

A pump can be employed to drive the JRM, and thus to drive the JJs. Signal and idler ports can be fed to the JPC via separate ports, and also to coupling capacitors of the JPC operatively coupled, such as connected, to the JRM.

By employing one or more suitable IMNCs, the resultant wideband JPC, including the IMNCs, can be functional in an amplification mode or in a conversion mode. In the amplification mode, the parametric converter device can act as a quantum limited amplifier amplifying readout signals carrying information on qubit states. In the conversion mode, the parametric converter device can act as a Josephson mixer, performing frequency conversion or converting a readout signal from one frequency to another frequency. Via the construction and/or use of the one or more parametric converter devices described herein, resiliency can be built into quantum operations, such as at the readout end of such quantum operations. This resiliency can include ability to simultaneously readout across a wide bandwidth range, simultaneously amplify one or more readout signals, and/or simultaneously convert one or more frequencies across a wide frequency range.

That is, generally, a JPC device according to one or more embodiments described herein can comprise one or more of the following: a wrap-around pump circuit which can optimally pump the JPC device at all four nodes of the JRM; when shorted to ground the pump circuit can allow for flux bias to be fed from a DC current in the pump circuit, thus allowing for omitting an external coil; a high saturation power (HSP) JRM which can use arrays of Josephson junctions in place of single JJs; a square JRM with corner junctions avoiding undesired asymmetry in through crossovers to bring together pairs of nodes for the impedance matching networks; and/or single-ended idler and/or signal port implementations.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. However, in various cases, that the one or more embodiments can be practiced without these specific details.

Generally, the subject computer processing system(s), methods, apparatuses, devices and/or computer program products can be employed to solve new problems that can arise through advancements in technology, computer networks, the Internet and the like.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more devices, systems and/or apparatuses that can facilitate executing one or more quantum operations to facilitate output of one or more quantum results. For example, FIG. 1 illustrates a block diagram of an example, non-limiting system 100 that can enhance quantum readout.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106, quantum readout/control electronics such as including Josephson parametric converter (JPC) device 112, a waveform generator 110, and/or a quantum logic circuit 108 comprising a plurality of qubits 107 (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum operation component 103 and/or for controlling the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as by a component of a classical system coupled to and/or in communication with the quantum system 101.

The waveform generator 110 can perform one or more quantum processes, calculations and/or measurements for operating one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. That is, the waveform generator 110, such as in combination with the quantum processor 106, can execute operation of a quantum logic circuit on the plurality of qubits 107 of the quantum logic circuit 108 (e.g., qubit 107A, 107B and/or 107C). In response, the quantum operation component 103 can output one or more quantum job results, such as one or more quantum measurement readouts 120, in response to the quantum job request 104.

In one or more embodiments, the quantum processor 106 can comprise the quantum logic circuit 108.

The quantum logic circuit 108 and a portion or all of the waveform generator 110 can be contained in a cryogenic environment, such as generated by a cryogenic chamber 116, such as a dilution refrigerator. Indeed, a signal can be generated by the waveform generator 110 within the cryogenic chamber 116 to affect one or more of the plurality of qubits 107. Where the plurality of qubits 107 are superconducting qubits, cryogenic temperatures, such as about 4K or lower can be employed to facilitate function of these physical qubits. Accordingly, the elements of the quantum logic circuit 108 also are to be constructed to perform at such cryogenic temperatures.

The JPC device 112 can separately function in a plurality of modes, such as an amplification mode and a conversion mode. In the amplification mode, the JPC device 112 can act as a quantum limited amplifier amplifying readout signals carrying information on qubit states. In the conversion mode, the JPC device 112 can act as a Josephson mixer, performing frequency conversion or converting a readout signal from one frequency to another frequency.

The JPC device 112 can include a Josephson ring modulator (JRM), two or more capacitances, one or more IMNCs and one or more signal and/or idler ports.

In view of such construction, readout over a wide bandwidth range can be facilitated, such as simultaneously of a plurality of qubit states of a plurality of qubits, such as about 1 to about 10 qubits, or such as about 5 to about 10 qubits, for a non-limiting example, by employing increased saturation power as compared to existing JPCs. In one example, for about 20 decibels (dB) of gain or about −20 dB of reflection in a conversion mode, wideband can be considered as about 300 MHz to about 1 GHz. Differently, for about 20 dB of gain, narrow band can be about 5 MHz. For about −20 dB reflection in a conversion mode, narrow band can be about 5 MHz to about 10 MHz. Also, in view of such construction, one or more frequencies can be converted, such as simultaneously, by employing increased saturation power as compared to existing JPCs.

That is in one embodiment, the JPC device 112 can be a cryogenic temperature electronic device, for example being disposed at a same dilution stage as the quantum logic circuit 108. In one or more embodiments, there can be some separation between the quantum logic circuit 108 and the JPC device 112 to protect the quantum logic circuit 108 and/or quantum processor 106 connected thereto from any noise or amplified signal produced by the JPC device 112. Separation can be provided by at least one stage of isolation. A microwave isolator and/or circulator can be employed to route the readout signal from the quantum logic circuit 108 to the wideband JPC device 112. The output amplified signal from the JPC device 112 can be routed to an output line from the cryogenic environment and not back to the quantum processor 106.

The following/aforementioned description(s) refer(s) to the operation of a single quantum program from a single quantum job request on a quantum logic circuit. This operation can include one or more readouts, such as occurring simultaneously in view of the JPC device 112, from cryogenic environment electronics within cryogenic chamber 116. Employment of the JPC device 112 can be scalable such as where two or more such JPC devices 112 can be comprised by the quantum system 101 in one or more embodiments. Further, one or more of the processes described herein can be scalable, also such as including additionally, and/or alternatively, execution of one or more quantum programs and/or quantum job requests in parallel with one another.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
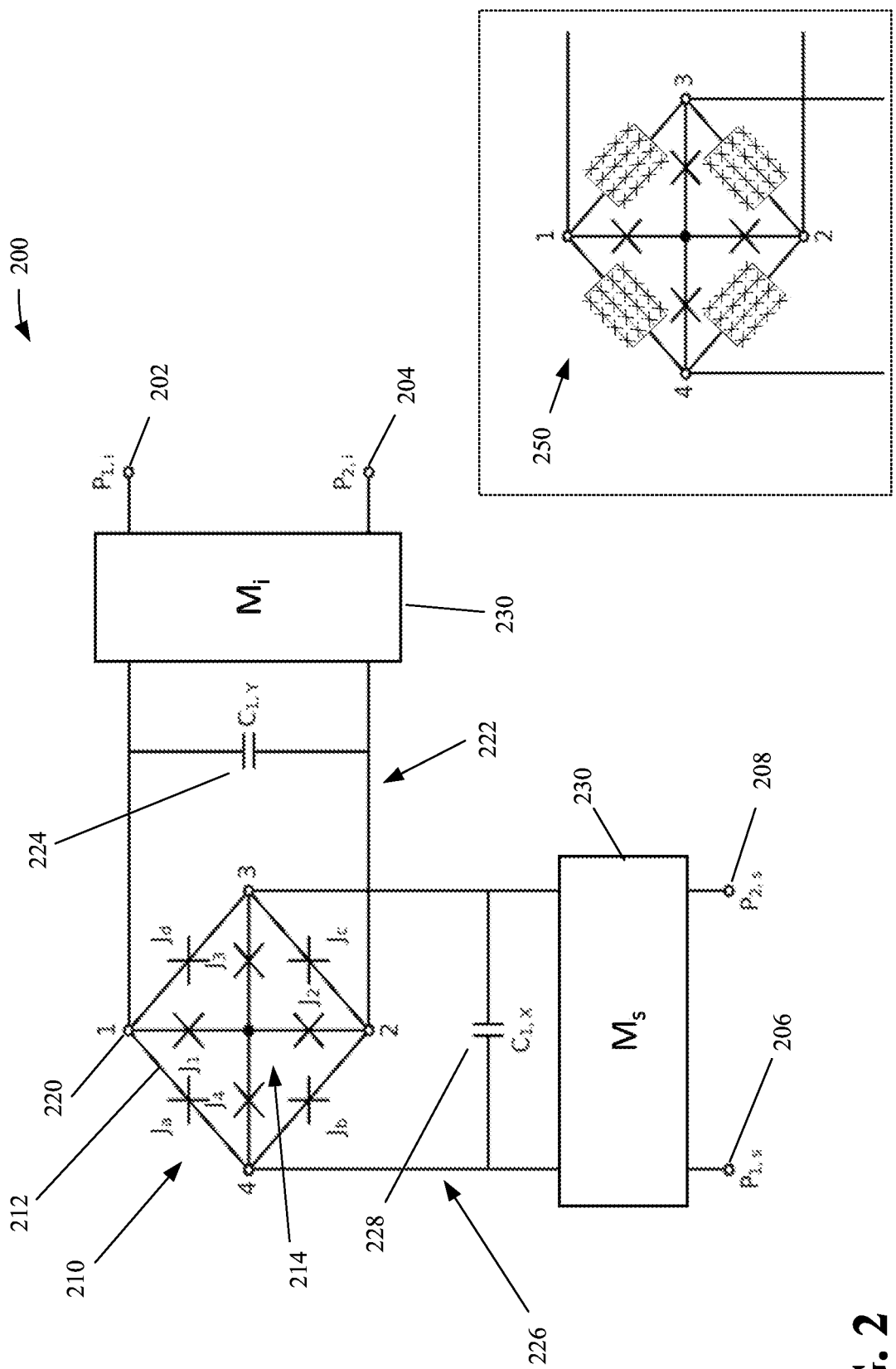
FIG. 2 illustrates a schematic diagram of a Josephson parametric converter device, in accordance with one or more embodiments described herein.

Turning now to FIG. 2, illustrates is a schematic diagram of a JPC device 200 that can act as a parametric converter having an amplification mode to generate gain over a bandwidth of interest, or can operate in conversion mode, where the frequency can be converted to an idler frequency. Generally, the JPC device 200 can be used for readout multiplexing. In a quantum system, where trying to readout multiple readout resonators, one readout line can be used for a plurality of readout resonators. That is, where there is typically a minimum frequency difference between resonators, a wider bandwidth can facilitate readout multiplexing. Further, more signals can be multiplexed and amplified with a high saturation power also provided by an embodiment of the wideband JPC device 200.

Additionally, it is noted that the JPC device 200 can also be used as a building block for additional electronics, such as for a Josephson directional amplifier or a Josephson isolator.

As illustrated, the JPC device 200 is nondegenerate and has two pairs of physical ports that have two different frequencies, referring to different microwave modes. The ports 202 and 204 can be for routing idler frequency, while the ports 206 and 208 can be for routing signal frequency.

The JPC 200 additionally can include a JRM 210, a pair of capacitances 224, 228, and one or more impedance matched networks or IMNCs 230.

The JRM 210 can, as shown, include an outer ring 212 and an inner section 214. The outer ring 212 can comprise four or more JJs separated/spaced apart from one another along the outer ring 212 by nodes 220.

The inner section 214 can comprise two or more JJs, such as operatively coupled in series between two of the nodes 220. Another two JJs can be included in the inner section 214 coupled in series between two additional nodes 220. The nodes 220 can be referred to in pairs 1,2 and 3,4, such as where one pair of nodes is connected to one ladder 222 and/or one capacitance 224, and where the other pair of nodes is connected to another ladder 226 and/or another capacitance 228. As shown, the capacitance 224 can be connected at the nodes 220 1, 2, and the capacitance 228 can be connected at the nodes 220 3,4. While the capacitances 224, 228 can be shunted across the JRM 210 as shown, one or more of the capacitances 224, 228 can be split into two capacitances, one for each node 1, 3 and 2,4 where the capacitors are now shunt capacitors to ground in one or more other embodiments.

In one or more embodiments, any one or more of the JJs of the JRM 210 can be replaced by more than one JJ, such as a matrix of JJs as shown at the JRM 250, also at FIG. 2. This concept can be applicable to any of the JPC devices 112, 300 and/or 600 and/or JRM 500.

Due to the capacitances 224, 228 being disposed across two different sets of the nodes 220 of the JRM 210, two different modes of the JPC device 200 can be facilitated, i.e., the signal resonant mode (X-mode) and the idler resonant mode (Y-mode). For example, calculations using the X (signal) and Y (idler) mode center frequencies, matching sections, and single-ended or differential excitations can be used to shape device response, such as being calculated in simulation.

Also as illustrated, one or more of the IMNCs 230 can be operatively coupled to the nodes 220 of the JRM 210, such as to increase the bandwidth of the JPC 200. The IMNCs 230 can be connected between the basic JPC unit cell (e.g., JRM 210 and capacitances 224, 228) and the external ports 202-208 or feed lines. At least one IMNC 230 can be included to function in conversion mode. At least one IMNC 230 can be included to function in amplification mode.

In one or more embodiments, the JPC 200 can function separately in either of these modes. In one or more other embodiments, such as based on particular construction of the IMNC(s) 230, the JPC 200 can be specialized for one mode or the other, based on different engineering requirements of the IMNC(s) 230.

Each IMNC 230 can be a lumped element IMNC or non-lumped element IMNC, such as employing distributed elements. For non-lumped element IMNCs, transmission line resonators (e.g., parallel or series) can be employed across the ladders 222 and 226.

The JPC central unit (e.g., JRM 210 and capacitances 224, 228 can be probed in simulation to aid in determining particular IMNCs 230 to employ. For example, the JPC central unit can be probed in simulation to determine the components to use for the IMNCs 230. In one embodiment, an element of a system coupled to the JPC central unit, can calculate, based on the probing in an amplification mode of the JPC central unit, a circuit equivalent to the JPC central unit. Harmonic balance simulations can allow the Josephson junction dynamics to be captured up to arbitrary order of accuracy defined by the limitation of computational resources. S-parameters can be extracted based on these simulations which can then be used to calculate approximate equivalent circuits for the JPC central unit. The circuit equivalent for a JPC central unit in amplification mode typically behaves approximately like a parallel resonator and negative resistance for a defined alternating current (AC) pump and for direct current (DC) flux bias. These values can be fed into well established microwave engineering methods and techniques to generate the wideband JPC's impedance matching networks. In another embodiment, an element of a system coupled to the JPC central unit, can calculate, based on the probing in simulation the conversion mode of the JPC central unit, a circuit equivalent to the JPC central unit, the circuit equivalent behaves approximately like a parallel resonator, a series resonator and positive resistance for a defined alternating current (AC) pump or for direct current (DC) flux bias. In the conversion mode, an X/Y mode couples to a frequency converted resonance of the other mode generating this additional series resonator section of the equivalent circuit. The total number of resonator sections in the equivalent circuit can be equal to two plus the total number of matching sections added to either the signal or idler sides. If correctly compensated for, this feature can increase device bandwidth even further than a design in amplification mode with the same number of matching IMNC sections.

In one or more embodiments, additional IMNC sections can be added to one or more of the ladders 222 and 226.

Figure 3:
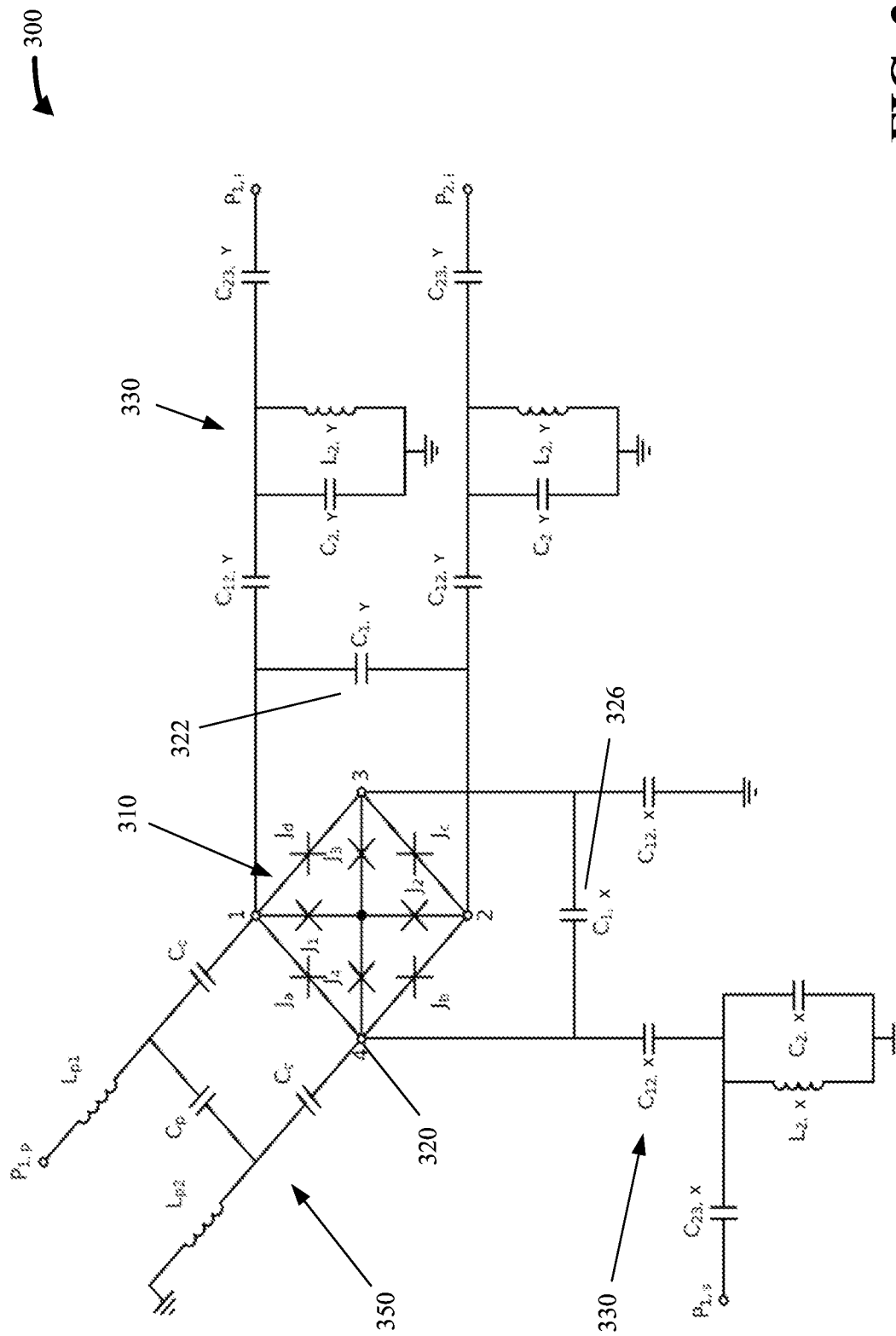
FIG. 3 illustrates a schematic diagram of another Josephson parametric converter device, in accordance with one or more embodiments described herein.

Looking next to FIG. 3, another JPC device 300 is illustrated including a JRM 310, capacitances 322 and 326, and IMNCs 330. Repetitive description of like elements and/or processes employed in respective embodiments is omitted for sake of brevity.

Examples of one type of circuits that can be comprised by the IMNCs 330 are illustrated. As shown, these lumped element IMNCs 330 each have one section, although further sections can be employed, such as to increase bandwidth even further.

Also shown at FIG. 3, a pump circuit 350 is illustrated coupled to the JRM 310, such as to a pair of nodes 320 of the JRM 310, such as to one node 320 connected to each different capacitance section/ladder 322, 326 of the JPC device 300. The pump circuit 350 can be actuated, such as via a system coupled to the JPC device 300, to drive the JRM 310, and thus to drive the JPC device 300, such as to give non-linear properties of the JPC device 300.

Figure 4:
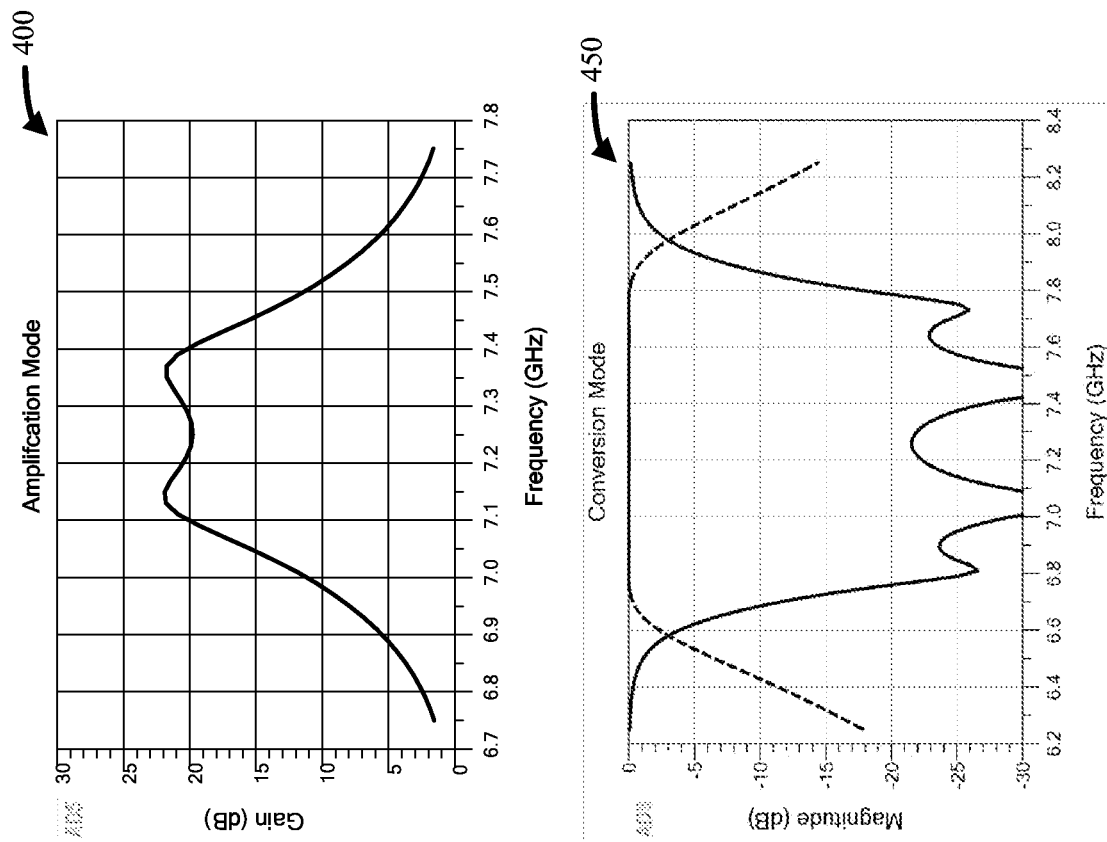
FIG. 4 provides a pair of graphs illustrating functional results of operation of the Josephson parametric converter device of FIG. 2 in an amplification mode and a conversion mode, in accordance with one or more embodiments described herein.

Looking next to FIG. 4, illustrated are a pair of graphs 400 and 450. Graph 400 illustrates performance of a JPC device in accordance with the embodiments discussed herein in amplification mode. Graph 400 is a plot of wideband JPC reflection gain, S11 in decibels (dB) vs frequency in gigahertz (GHz) of a device with single additional impedance matching networks on both the signal and idler ports. The signal frequency of this device is centered on about 7.25 GHz and the idler frequency on about 10 GHz. Graph 450 illustrates performance of a JPC device in accordance with the embodiments discussed herein in conversion mode. Graph 450 is plot of the reflection coefficient, S11 (solid line) in dB vs frequency in gigahertz (GHz) of a device with single additional impedance matching networks on both the signal and idler ports. Conversion efficiency (dashed line) is shown in dB with about 0 dB corresponding to 100% of the signal converted to the idler frequency. The signal frequency of this device is centered on about 7.25 GHz and the idler frequency on about 10 GHz.

That is, with respect to the JPC devices 200 or 300 thus far described, IMNC parameters can be dependent upon termination impedance, such as termination impedance at the ports at either the idler frequency or signal frequency, and/or can be dependent upon these signal and/or idler frequencies. Accordingly, a formula can be utilized, such as by the designer to determine optimal impedances and frequencies of the respective JPC device.

In general, if the impedance matched X and Y modes are chosen to have the same fractional bandwidth (FBW), the device response can be more difficult to predict because $f_X \neq f_Y$ and the reflection response can be a combination of the X and Y bandwidths in hertz (Hz) and not fractional bandwidth, where $f_x$ is the X-mode center frequency and $f_y$ is the Y-mode center frequency.

One method to address this case is to set the port impedances according to the relation:

$$\frac{Z_s}{Z_i} = \left(\frac{f_X}{f_Y}\right)^2$$

Additionally, the signal port can be excited single-ended such that the signal port impedance, $Z_s=50$ Ohm and the effective idler port impedance, $Z_i=100$ Ohm and the $$\left(\frac{f_X}{f_Y}\right)^2 = \frac{1}{2}.$$

These quantities are non-limiting and are provided but for an example. A benefit of single-ended designs can be that they do not require an external 180 degree hybrid on the single-ended port side. A 180 degree hybrid can be a 4 port microwave device which can be used to generate a differential excitation across the signal ports to excite the JPC resonant modes. The 2 outputs of a 180 degree hybrid can be 180 degrees out of phase with each other.

A single-end design replaces 1 signal port or 1 idler port or 1 of both with a shunt capacitance to ground. The corresponding impedance matching network section for that port can be folded into the remaining port to correctly impedance match the device. This is done through an equivalence between a differentially excited JPC and a single-ended excited JPC. For example, the values of the components in FIG. 3 on the single-ended signal side ($C_{12,X}$, $C_{23,X}$, $C_{2,X}$, and $C_{1,X}$) are set based on the formulas, $$J_{12,SE} = 2\sqrt{2} J_{12,D} \text{ and } J_{23,SE} = \frac{2}{\sqrt{2}} J_{23,D}$$

where $J_{12}$ and $J_{23}$ are the admittance inverter values used in setting the capacitances. SE is used to designate single-ended and D designates differential. The differential form of the signal side is not shown in FIG. 3 though it can be inferred from an identical form of the idler side.

That is, in one or more embodiments, the signal port or the idler port, or both, can be excited single-endedly by replacing one termination with a shunt capacitor to ground. A single-ended design also can reduce complexity when used as a building block in Josephson isolator (JIS) and Josephson directional amplifier (JDA) designs.

Figure 5:
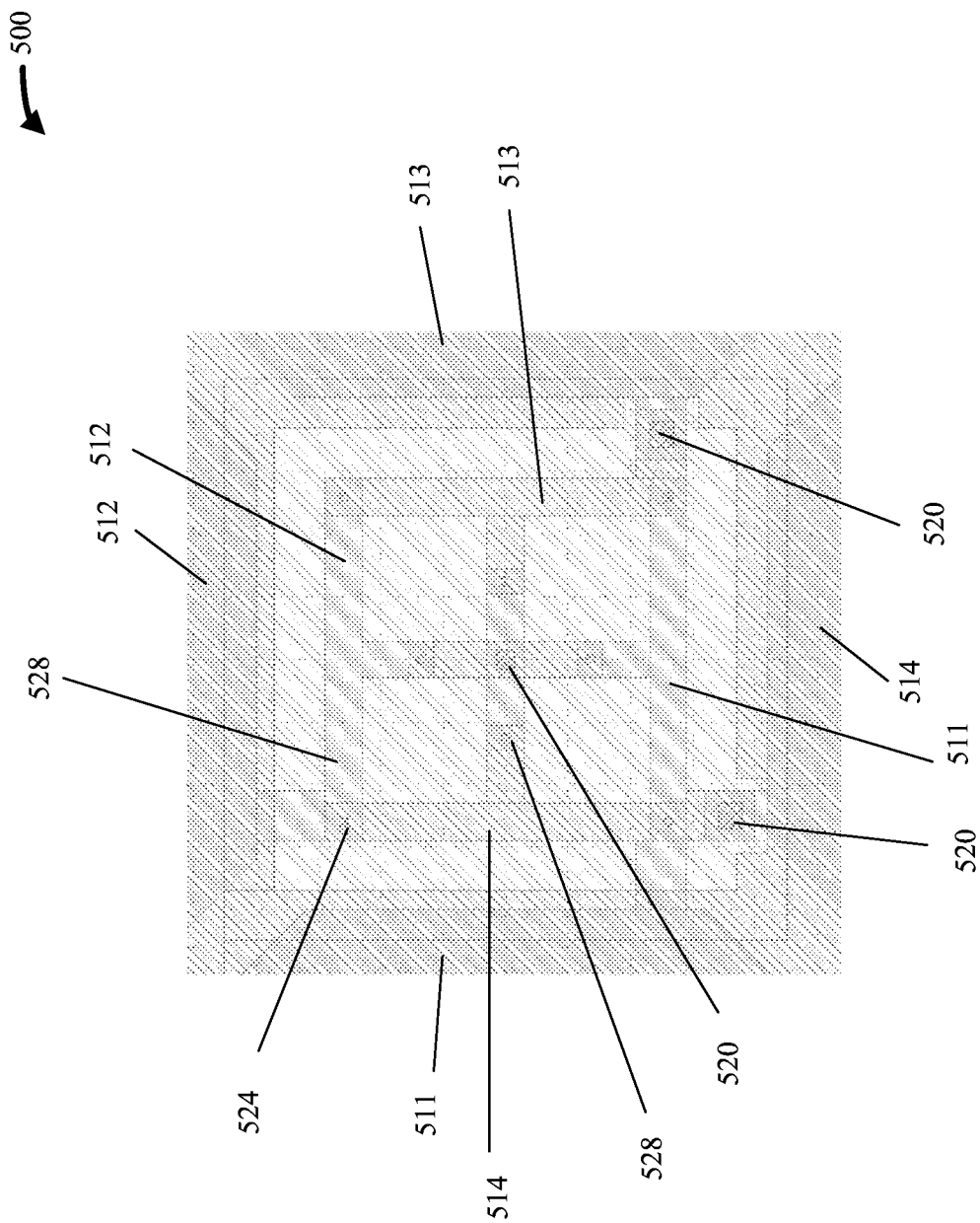
FIG. 5 illustrates a schematic layout of a portion of a Josephson parametric converter device, in accordance with one or more embodiments described herein.

Referring now to FIG. 5, a layout diagram of a JRM 500, such as for use with any of the JPC devices 112, 200, 300 and/or 600, is illustrated. The layout of the JRM 500 can include a square JRM configuration as shown. The JRM 500 can include a stackup of a plurality of layers, such as metallization layers, such as two or more layers. In one embodiment, three layers can be included.

As illustrated at FIG. 5, the nodes 511-514 (e.g., nodes) of the JRM 500 are disposed at sides of the stackup footprint. The first node 511, second node 512, third node 513 and fourth node 514 each is disposed at a different side. First node 511 and second node 512 can be part of a signal capacitor. Fourth node 514 and third node 513 can be part of an idler capacitor.

Node 1 (511) and node 2 (512), and can be on a first (e.g., top) metallization layer. Node 3 (513) can be on a bottom metallization layer, different from the layer of nodes 1 and 2, such as inside the JRM 500 and can connect to the top layer through a via 520, such as an outer via 520. Node 4 (514) can be on the bottom metallization layer inside the JRM 500 and can connect to the top layer through a via 520, such as an outer via 520.

An inner ring of Josephson junctions 528 can comprise at least four JJs. An outer ring of Josephson junctions 524 can comprise at least four JJs. One or more of these JJs can be replaced by a JJ matrix, such as illustrated at JRM 250 at FIG. 2. For example, each of the outer ring JJs 524 can be replaced by a JJ matrix of a plurality of JJs.

As illustrated, the JJs 524 are placed at the corners of the footprint of the JRM 500. This can aid in minimizing parasitics or crossover capacitance between at least two metallization layers of the JRM 500.

One benefit of this layout of a JRM 500 can be that each node coming off the JRM can experience an electrically symmetric environment to the other node of its pair (e.g., directly across the center of the JRM therefrom, such as where nodes 1 and 2 are paired and where nodes 3 and 4 are paired), thus minimizing any parasitic inductance or capacitance which would have lower bandwidth and increase design difficulty.

Figure 6:
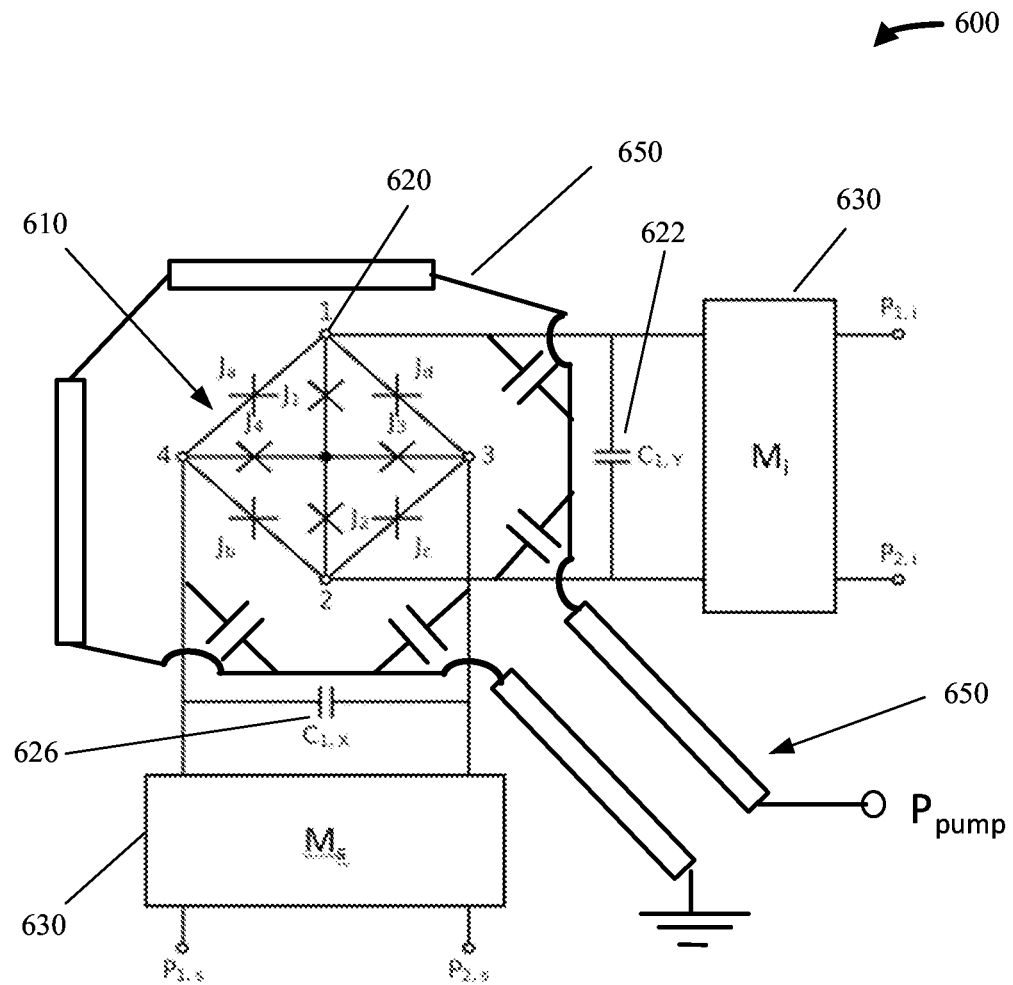
FIG. 6 illustrates a schematic diagram of yet another Josephson parametric converter device, in accordance with one or more embodiments described herein.

Turning next to FIG. 6, another embodiment of a JPC device is illustrated at 600. Repetitive description of like elements and/or processes employed in respective embodiments is omitted for sake of brevity.

The JPC device 600 comprises a JRM 610, capacitances 622 and 626, IMNCs 630 and a pump circuit 650. The pump circuit 650 drives the JRM 610 and thus drives the JPC device 600.

A pump tone and a flux bias from direct current (DC) can be both sent along a pump circuit wrapped around the JRM 610 to drive the JRM 610, which can allow for omission of an external flux biasing coil. The pump circuit 650 can be shorted to ground at one of two opposite ends thereof to allow a DC current input to flux bias the JRM 610.

Generally, each of an amplification mode or a conversion mode embodiment of the JPC device 600 can have a pump circuit which can inject a pump tone at a specified frequency. For an amplification mode JPC the pump tone can be the sum frequency $f_p=f_s+f_i$. For a conversion mode JPC the pump tone can be the difference frequency $f_p=f_i-f_s$ (assuming $f_i>f_s$). To operate, JPCs can employ a DC bias or flux bias which can be injected via magnetic fields from an external coil. However, one or more embodiments described herein can omit the external coil and can supply DC bias or flux bias via one or more transmission lines wrapped around and capacitively connected to nodes of the JPC.

As illustrated, the pump circuit 650 can provide a capacitive connection for the pump circuit 650, with the pump circuit 650 setting the signal and idler frequencies. No connection for flux bias is shown. The pump circuit 650 is connected to each of the nodes 620 of the JRM 610 and wraps around the JPC device 600 to thereby flux bias through the JPC device 600 and optimally pump all four nodes 620 with the suitable pump power.

As shown, a series of transmission lines capacitively couple into each node 620 of the JRM 610. Different length transmission lines can be used for different primary mode of the JPC device 600 (e.g., amplification primary mode or conversion primary mode). Where the pump circuit 650 is shorted to ground, DC current can be sent down these transmission lines to thereby flux bias the JPC device 600. This can be as opposed to existing technologies where external coils are employed to feed flux to a respective JRM.

An advantage of the pump circuit 650 is that power can be coupled into all nodes 620 of a JRM, thus reducing non-ideal imbalance between pump current at each of the nodes 620 with only connecting to two nodes, as shown at FIG. 3 with the pump circuit 350. That is, employing the pump circuit 350 can limit the performance of the JPC device 300, such as by limiting the available bandwidth of the JPC device 300, as compared to use of the pump circuit 650.

Figure 7:
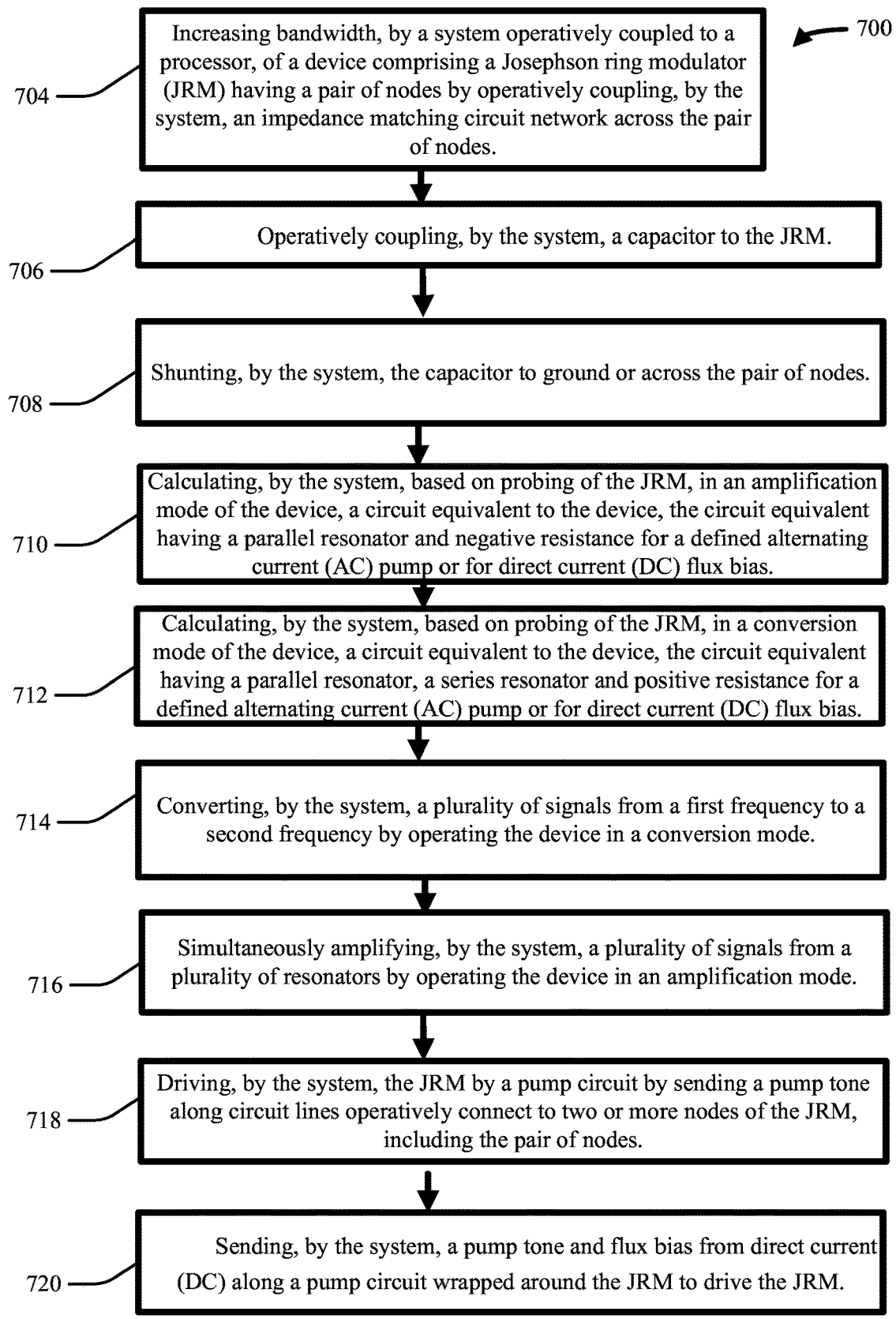
FIG. 7 illustrates a flow diagram of an example method to form a tiling arrangement, in accordance with one or more embodiments described herein.

Next, FIG. 7 illustrates a flow diagram of an example, non-limiting method 700 that can facilitate a process to increase bandwidth and/or saturation power of a parametric converter device and/or relative to a Josephson ring modulator (JRM). While the non-limiting method 700 is described relative to the JPC device 112 of FIG. 1, the non-limiting method 700 can be applicable also to other systems and/or devices described herein, such as the JPC devices 200, 300 and 600 and JPM 500 illustrated at FIGS. 2, 3, 6 and 5, respectively. Repetitive description of like elements and/or processes employed in respective embodiments is omitted for sake of brevity.

At 704, the non-limiting method 700 can comprise increasing bandwidth, by a system operatively coupled to a processor (e.g., quantum system 101), of a device (e.g., JPC device 112) comprising a Josephson ring modulator (JRM) having a pair of nodes by operatively coupling, by the system, an impedance matching circuit network across the pair of nodes.

At 706, the non-limiting method 700 can comprise operatively coupling, by the system (e.g., quantum system 101), a capacitor to the JRM.

At 708, the non-limiting method 700 can comprise shunting, by the system (e.g., quantum system 101), the capacitor to ground or across the pair of nodes.

At 710, the non-limiting method 700 can comprise calculating, by the system (e.g., quantum system 101), based on the probing of the JRM, in an amplification mode of the device, a circuit equivalent to the device, the circuit equivalent having a parallel resonator and negative resistance for a defined alternating current (AC) pump or for direct current (DC) flux bias.

At 712, the non-limiting method 700 can comprise calculating, by the system (e.g., quantum system 101), based on the probing in a conversion mode of the device, a circuit equivalent to the device, the circuit equivalent having a parallel resonator, a series resonator and positive resistance for a defined alternating current (AC) pump or for direct current (DC) flux bias.

At 714, the non-limiting method 700 can comprise converting, by the system (e.g., quantum system 101), a plurality of signals from a first frequency to a second frequency by operating the device in a conversion mode.

At 716, the non-limiting method 700 can comprise simultaneously amplifying, by the system (e.g., quantum system 101), a plurality of signals from a plurality of resonators by operating the device in an amplification mode.

At 718, the non-limiting method 700 can comprise driving, by the system (e.g., quantum system 101), the JRM by a pump circuit by sending a pump tone along circuit lines operatively connect to two or more nodes of the JRM, including the pair of nodes.

At 720, the non-limiting method 700 can comprise sending, by the system (e.g., quantum system 101), a pump tone and flux bias from direct current (DC) along a pump circuit wrapped around the JRM to drive the JRM.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, devices and/or methods of use provided herein relate to a device that can provide bandwidth and/or saturation power to readout and amplify a plurality of readout electronics and/or to convert one or more frequencies. In quantum technology, the one or more systems, devices and/or methods of use provided herein can be employed to simultaneously readout a plurality of qubit resonators. A device can comprise a Josephson ring modulator (JRM) having a pair of nodes, and an impedance matching circuit network operatively connected across the pair of nodes. The device can be separately operable in an amplification mode and in a conversion mode.

Referring now to FIGS. 2 to 6, in addition to FIG. 1, a Josephson parametric converter (JPC) device can be employed. The JPC device can include a Josephson ring modulator (JRM), which is a nonlinear dispersive element based on Josephson junctions that can perform three-wave mixing of microwave signals at the quantum limit. The JRM can include a plurality of Josephson Junctions (JJs). In order to construct a non-degenerate parametric device that is the Josephson parametric converter (JPC), which is capable of amplifying and/or mixing microwave signals at the quantum limit, the JRM can be operatively coupled to one or more impedance matching network circuits (IMNCs).

A pump can be employed to drive the JRM, and thus to drive the JJs. Signal and idler ports can be fed to the JPC via separate ports, and also to coupling capacitors of the JPC operatively coupled, such as connected, to the JRM.

By employing one or more suitable IMNCs, the resultant JPC, including the IMNCs, can be functional in an amplification mode and in a conversion mode. In the amplification mode, the parametric converter device can act as a quantum limited amplifier amplifying readout signals carrying information on qubit states. In the conversion mode, the parametric converter device can act as a Josephson mixer, performing frequency conversion or converting a readout signal from one frequency to another frequency. Via the construction and/or use of the one or more parametric converter devices described herein, resiliency can be built into quantum operations, such as at the readout end of such quantum operations. This resiliency can include ability to simultaneously readout across a wide bandwidth range, simultaneously amplify one or more readout signals, and/or simultaneously convert one or more frequencies across a wide frequency range.

Indeed, in view of the one or more embodiments described herein, a practical application of the parametric converter devices described herein can be ability to simultaneously amplify a plurality of readout signals, such as for reading out quantum states of a plurality of qubits. This is a useful and practical application of computers, providing efficient and quick readout in a quantum process than can be time-limited due to degeneration, noise and/or coherency, and thus facilitating enhanced (e.g., improved and/or optimized) operation of the respective quantum system. In a non-quantum system, similar benefits can be achieved, for reading out a plurality of electronics in a quick and efficient manner. Overall, such computerized tools can constitute a concrete and tangible technical improvement in the fields of quantum computing and readout electronics.

Additionally, when scaling up quantum systems, larger quantum systems can include increased multiplexing in readout and can experience frequency crowding. In such case, frequency conversion and multiplexed readout can be beneficial, such as can both be provided by one or more JPC devices as described herein.

Furthermore, one or more embodiments described herein can be employed in a real-world system based on the disclosed teachings. For example, one or more embodiments described herein can function within a quantum system, e.g., to facilitate enhanced quantum state readout, where the quantum system can receive as input a quantum job request and can measure a real-world qubit state of one or more qubits, such as superconducting qubits, of the quantum system.

Moreover, a device and/or method described herein can be implemented in one or more domains, such as quantum domains, to enable scaled quantum program executions. Indeed, use of a device as described herein can be scalable, such as where a device described herein can be employed in quantity with a single quantum system or at multiple quantum systems.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, facilitate program and/or program instruction execution, such as relative to qubit state readout, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively simultaneously readout a plurality of qubit states across a wide bandwidth range, as the one or more embodiments described herein can facilitate this process. And, neither can the human mind nor a human with pen and paper simultaneously readout a plurality of qubit states across a wide bandwidth range, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 8:
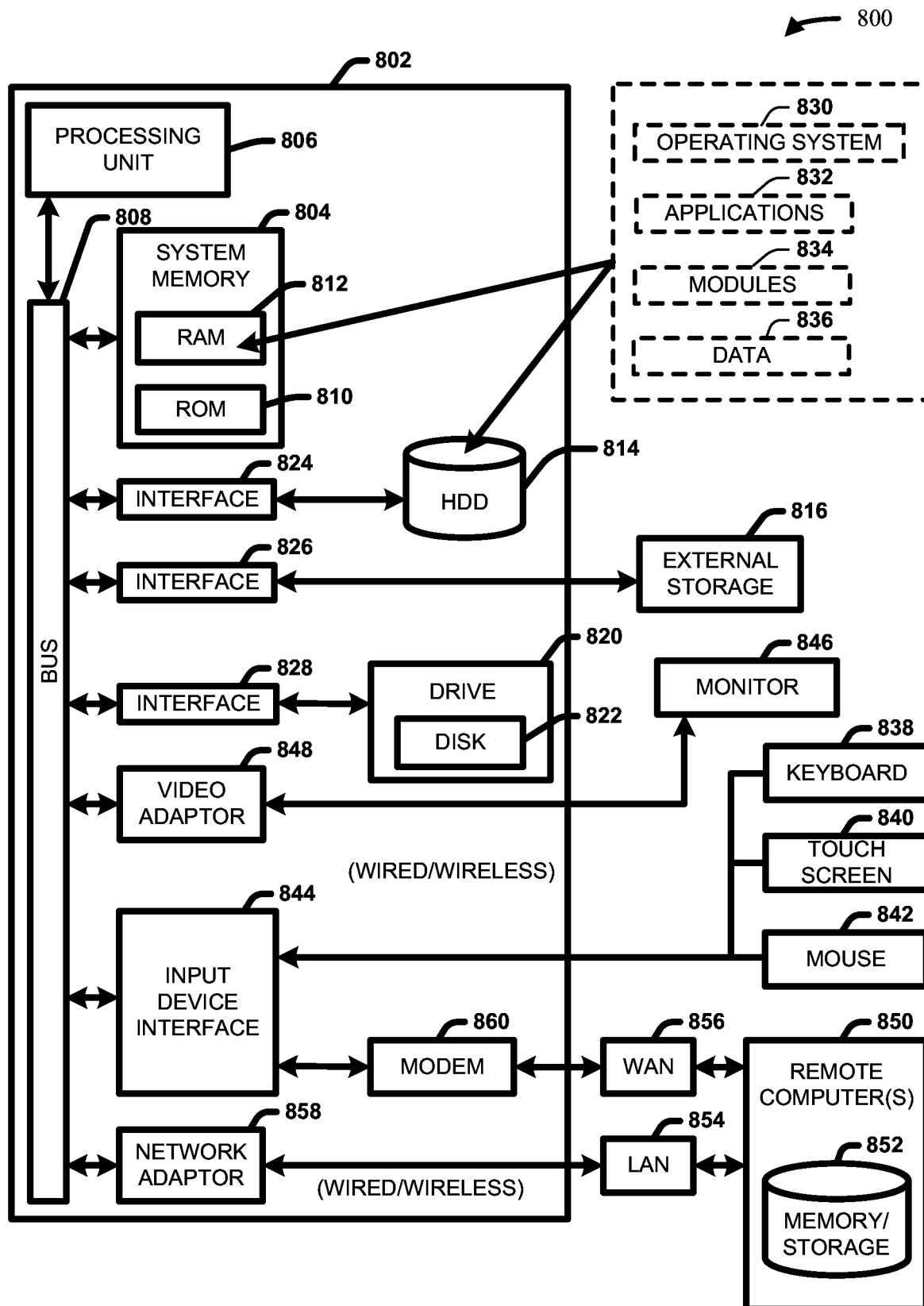
FIG. 8 illustrates a block diagram of an example, non-limiting, operating environment in which one or more embodiments described herein can be facilitated.
Figure 9:
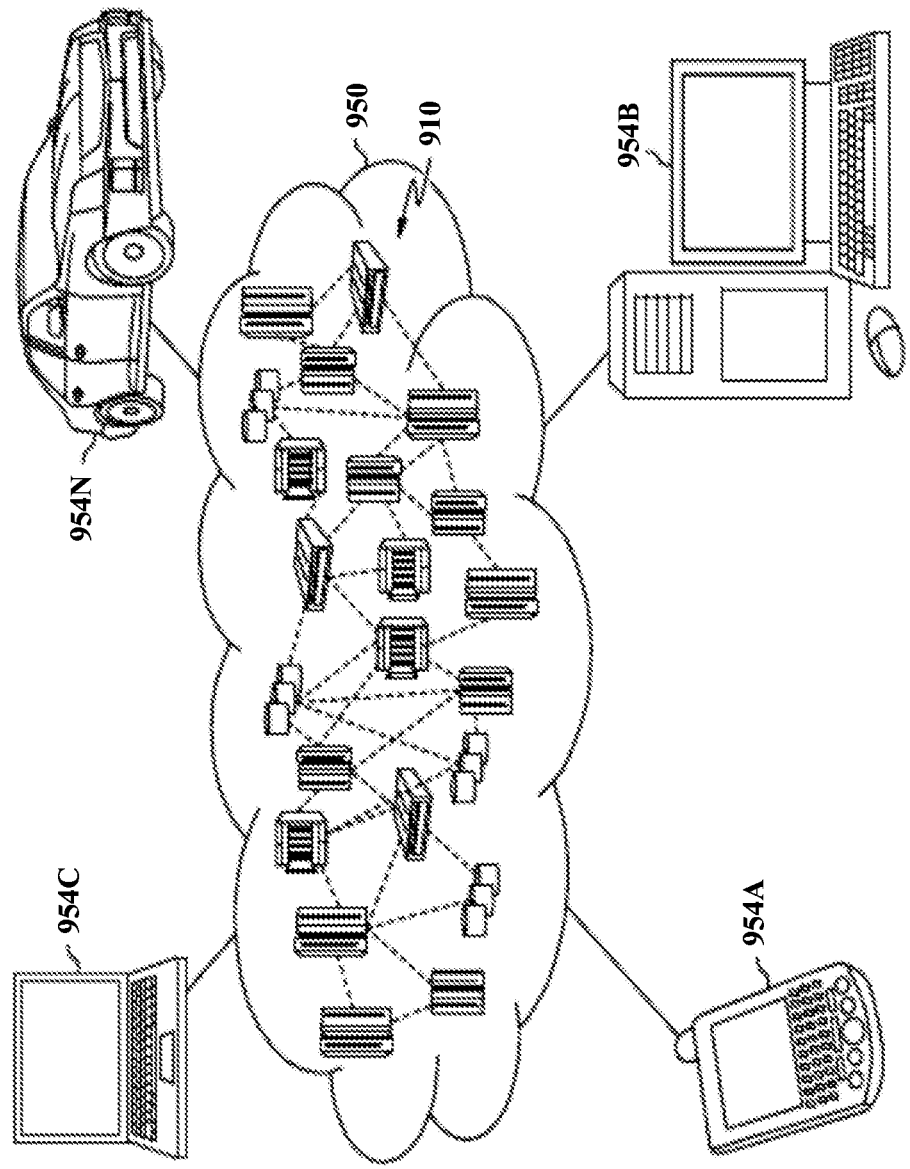
FIG. 9 illustrates a block diagram of an example, non-limiting, cloud computing environment in accordance with one or more embodiments described herein.
Figure 10:
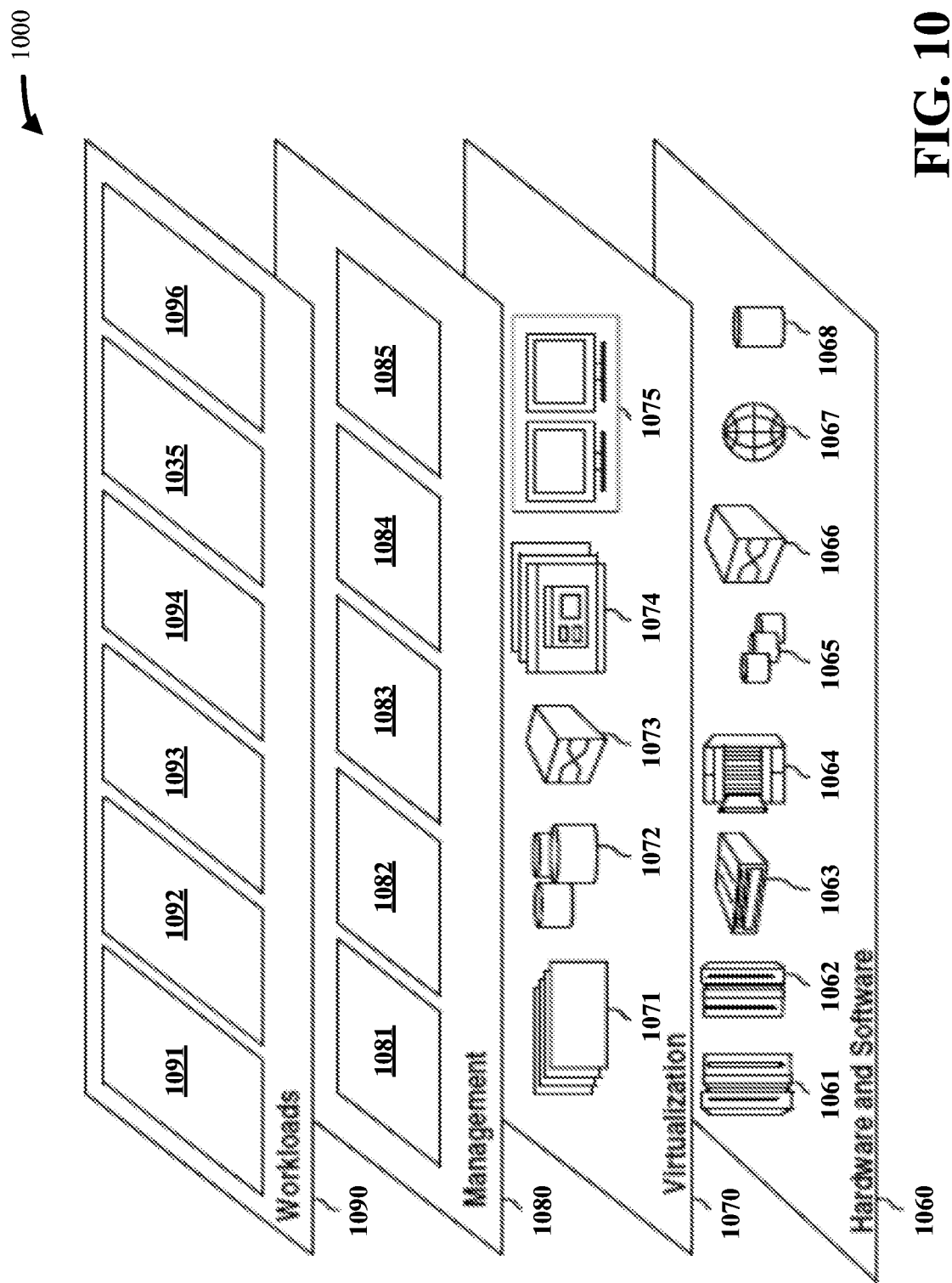
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 in which one or more embodiments described herein at FIGS. 1-7 can be implemented. For example, one or more components and/or other aspects of embodiments described herein can be implemented in or be associated with, such as accessible via, the operating environment 800. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, mini-computers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 for implementing one or more embodiments of the aspects described herein can include a computer 802, the computer 802 including a processing unit 806, a system memory 804 and/or a system bus 808. One or more aspects of the processing unit 806 can be applied to processors such as 106 of the non-limiting system 100. The processing unit 806 can be implemented in combination with and/or alternatively to processors such as 106.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction(s). For example, memory 804 can store computer and/or machine readable, writable and/or executable components and/or instructions that, when executed by processing unit 806, can facilitate execution of the one or more functions described herein relating to non-limiting system 100, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLU- ETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A device, comprising:
   a Josephson parametric converter (JPC) comprising:
      a Josephson ring modulator (JRM) having nodes respectively between sets of Josephson junctions; and
      an impedance matching circuit network operatively connected across a pair of the nodes, wherein the impedance matching circuit network increases a frequency bandwidth of the JPC device.

2. The device of claim 1, wherein the JPC further comprises:
   a capacitor connected to the JRM, wherein the capacitor is a grounded shunt capacitor or is shunted across the pair of the nodes.

3. The device of claim 1, wherein the JPC further comprises:
   another impedance matching circuit network operatively connected across another pair of the nodes.

4. The device of claim 1, wherein the device is separately operable in an amplification mode or in a conversion mode.

5. The device of claim 4, wherein the JRM is probeable in the amplification mode or in the conversion mode to determine an equivalent resistance and equivalent impedance slope to determine one or more components for being employed as the impedance matching circuit network.

6. The device of claim 1, wherein the JPC further comprises:
   a pump circuit capacitively connected to another pair of the nodes to excite a common-mode of the JRM.

7. The device of claim 6, wherein the pump circuit wraps majoratively around a full circumference of the JRM.

8. The device of claim 6, wherein the pump circuit comprises transmission line sections that wrap around the JRM and capacitively couple to four of the nodes of the JRM at determined intervals along the transmission line.

9. The device of claim 1, wherein four of the nodes are oriented at corners of the JRM having a quadrilateral two-dimensional footprint.

10. The device of claim 1, wherein at least one set of the sets of Josephson junctions comprises a matrix of Josephson junctions connected in series between adjacent nodes along an external ring of the JRM.

11. A method, comprising:
   increasing bandwidth, by a system operatively coupled to a processor, of a Josephson parametric converter (JPC) device comprising a Josephson ring modulator (JRM) nodes respectively between the sets of Josephson junctions, wherein the increasing the bandwidth comprises:
      operatively coupling, by the system, an impedance matching circuit network across a pair of the nodes, wherein the impedance matching circuit network increases a frequency bandwidth of the JPC device.

12. The method of claim 11, further comprising:
   operatively coupling, by the system, a capacitor to the JRM; and
   shunting, by the system, the capacitor to ground or across the pair of the nodes.

13. The method of claim 11, further comprising:
   calculating, by the system, based on probing of the JRM, a circuit equivalent to the device, the circuit equivalent having a parallel resonator and a resistance for a defined alternating current (AC) pump or for direct current (DC) flux bias.

14. The method of claim 11, further comprising:
simultaneously amplifying, by the system, a plurality of signals from a plurality of resonators by operating the device in an amplification mode.

15. The method of claim 11, further comprising:
converting, by the system, a plurality of signals from a first frequency to a second frequency by operating the device in a conversion mode.

16. The method of claim 11, further comprising:
driving, by the system, the JPC by a pump circuit by sending a pump tone along circuit lines operatively connected to two or more of the nodes of the JRM, including the pair of the nodes.

17. The method of claim 11, further comprising:
sending, by the system, a pump tone and flux bias from direct current (DC) along a pump circuit wrapped around the JRM to drive the JRM.

18. A system, comprising:
a processor;
a chip controlled by the processor; and
a Josephson parametric converter (JPC) device, comprising:
  a Josephson ring modulator (JRM) having sets of Josephson junctions and nodes respectively between the sets of Josephson junctions; and
  an impedance matching circuit network operatively connected across a pair of the nodes, wherein the impedance matching circuit network increases a frequency bandwidth of the JPC device.

19. The system of claim 18, wherein the device further comprises:
another impedance matching circuit network operatively connected across another pair of nodes.

20. The system of claim 19, wherein the pair of nodes and the other pair of nodes are connected to the external circuit ring of the JRM in an order alternating about the ring between a node of the pair of nodes and a node of the other pair of nodes.

21. A device, comprising:
a Josephson ring modulator (JRM) having a plurality of nodes respectively between sets of Josephson junctions;
one or more impedance matching circuit networks operatively connected to the JRM via two nodes of the plurality of nodes, wherein the one or more impedance matching circuit networks increase a frequency bandwidth of the device; and
a pumping circuit operatively connected to the JRM.

22. The device of claim 21, wherein the pumping circuit is operatively coupled to four nodes of the plurality of nodes of the JRM by transmission line sections that wrap around the JRM.

23. The device of claim 21, further comprising:
a signal frequency port and an idler frequency port operatively connected to the JRM, wherein one of the signal frequency port or the idler frequency port is excited single-endedly.

24. A device, comprising:
a plurality of stacked layers;
a Josephson ring modulator (JRM) arranged at one or more of the stacked layers, wherein nodes of the JRM are oriented at corners of a footprint of the JRM on one of the stacked layers;
and
an impedance matching circuit network operatively connected across a pair of the nodes,
wherein the impedance matching circuit network increases a frequency bandwidth of the device.

25. The device of claim 24, wherein the nodes of the JRM are connected in series in an external ring with matrices of Josephson junctions further connected in series between adjacent nodes along the external ring.

\* \* \* \* \*